US006400293B1

(12) United States Patent
Richardson

(10) Patent No.: US 6,400,293 B1
(45) Date of Patent: Jun. 4, 2002

(54) DATA COMPRESSION SYSTEM AND METHOD

(76) Inventor: Ric B. Richardson, 2134 Main, #260, Huntington Beach, CA (US) 92648

( * ) Notice: Subject to any disclaimer, the term of this patent is extended or adjusted under 35 U.S.C. 154(b) by 0 days.

(21) Appl. No.: 09/467,218

(22) Filed: Dec. 20, 1999

(51) Int. Cl.[7] .................................................. H03M 7/00

(52) U.S. Cl. ........................................ 341/106; 711/220

(58) Field of Search .............................. 341/83, 87, 67, 341/51; 364/900; 358/133; 711/220

(56) References Cited

U.S. PATENT DOCUMENTS 3,717,851 A * 2/1973 Cocke et al. ............ 340/172.5
3,925,780 A * 12/1975 Van Voorhis ............... 340/347
4,232,375 A * 11/1980 Paugstat et al. ............ 364/900

* cited by examiner

*Primary Examiner*—Peguy JeanPierre
*Assistant Examiner*—Joseph J Lauture
(74) *Attorney, Agent, or Firm*—Christopher J. Rourk; Akin Gump Strauss Hauer & Feld, LLP

(57) ABSTRACT

A system for encoding data is provided. The system includes a number parser that breaks down a field that has many digits into a set of data strings that each has a fixed number of digits. A logarithmic converter is connected to the number parser, and converts each data string into a compressed string that has less than the fixed number of digits. A compiler connected to the number parser and the logarithmic converter receives the compressed strings from the logarithmic converter and forms a new field that has many digits.

20 Claims, 5 Drawing Sheets

RECEIVE LARGE NUMBER
402
PARSE INTO SMALLER NUMBER
404
COMPRESS SMALLER NUMBERS
406
FORM NEW LARGE NUMBER
408
SMALL ENOUGH?
410
TRANSMIT NUMBER
414
END
416
INCREMENT LOOP COUNTER
412
400

DATA COMPRESSION SYSTEM AND METHOD

FIELD OF THE INVENTION

The present invention pertains to data compression systems and methods, and more particularly to a system and method for data compression that allows data to be logarithmically compressed.

BACKGROUND

Data compression systems and methods are typically defined as lossless or lossy. A lossless data compression system and method compresses data in a manner that allows the data to be subsequently expanded without any loss of data. A lossy data compression system and method compresses data in a manner that causes some loss of data when the data is subsequently expanded. Lossless and lossy data compression systems and methods are typically used for different applications.

In general, lossless data compression is used in connection with data where each bit of data is important, such as text data and financial data. Lossy data compression may be used for types of data where some loss of data may be tolerated without a noticeable decrease in the quality of the data, such as audio or video data. Lossy data compression techniques were developed for these types of data in part because the data files for audio and visual data tend to be much larger than other types of data files.

Although lossless and lossy data compression methods and systems have been developed, the compressed data for either type of compression still requires a significant amount of data storage space.

SUMMARY OF THE INVENTION

Therefore, a system and method for compressing data are required that overcome the disadvantages of known systems and methods for compressing data.

In particular, a system and method for compressing data are required that provide significant reductions in compressed file size and lossless data storage.

In accordance with the present invention, a system for compressing data is provided. The system includes a number parser that breaks down a field that has many digits into a set of data strings that each has a fixed number of digits. A logarithmic converter is connected to the number parser, and converts each data string into a compressed string that has less than the fixed number of digits. A compiler connected to the number parser and the logarithmic converter receives the compressed strings from the logarithmic converter and forms a new field that has many digits. This new field may then be input into the number parser.

The present invention provides numerous important technical advantages. One important technical advantage of the present invention is a data compression system that achieves logarithmic compression ratios without resulting in data loss. Data compression ratios in excess of 100 to 1 may be achieved using the data compression system of the present invention.

Those skilled in the art will further appreciate the advantages and superior features of the invention together with other important aspects thereof on reading the detailed description which follows in conjunction with the drawings.

DETAILED DESCRIPTION OF EXEMPLARY EMBODIMENTS

Figure 1:
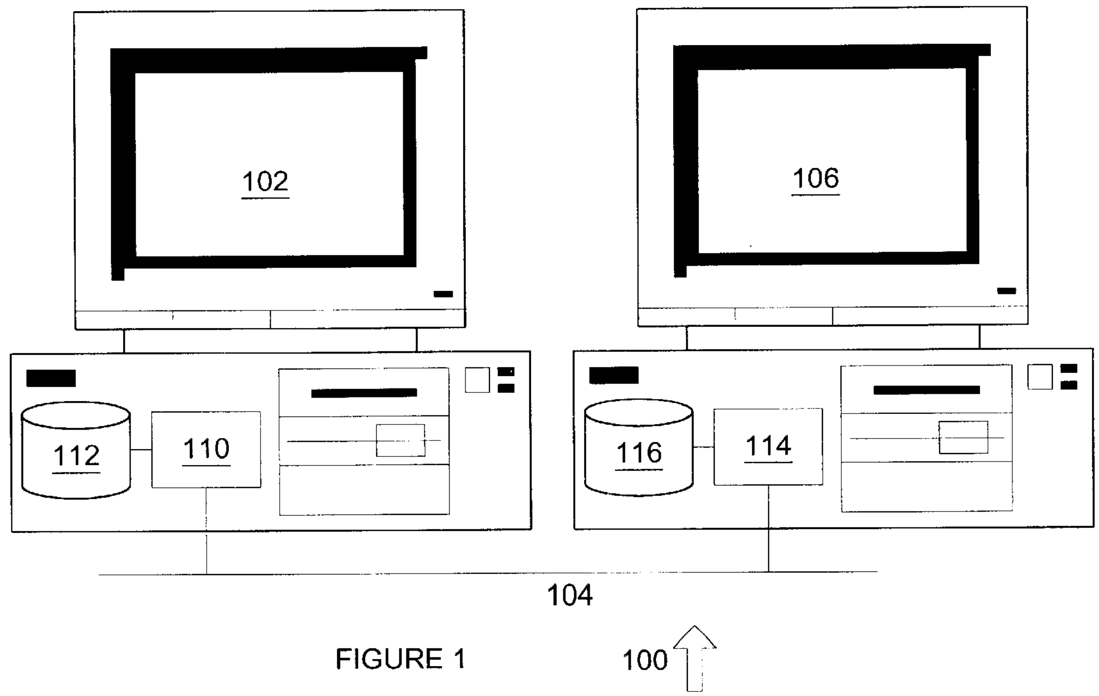
FIG. 1 is a diagram of a logarithmic data compression and transmission system in accordance with an exemplary embodiment of the present invention.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

FIG. 1 is a diagram of a logarithmic data compression and transmission system 100 in accordance with an exemplary embodiment of the present invention. Logarithmic data compression and transmission system 100 may be used to compress and transfer large amounts of data using a lossless logarithmic data compression technique, such that files may be reduced to a small fraction of their original size without any loss of data.

Logarithmic data compression and transmission system 100 includes a platform 102, which is connected to communications media 104, and a platform 106, which is also connected to communications media 104. Exemplary platform 102 includes logarithmic data compression system 110 and large number storage system 112. Likewise, exemplary platform 106 includes logarithmic data decompression system 114 and large number storage system 116. Each platform 102 and 106 may include both logarithmic data compression system 110 and logarithmic data decompression system 114, to allow two-way transmission of compressed data. Alternatively, the configuration shown may be utilized to broadcast data to a large number of users, to maximize bandwidth utilization, or for other suitable purposes.

Platform 102 is data processing equipment that is used to process large data strings. For example, platform 102 may be a personal computer, a laptop computer, a server, a super computer, or other suitable computing platforms. Platform 102 may be used in suitable data processing applications, such as applications requiring the handling of large volumes of text, numerical data, or a suitable combination of text and numerical data. Likewise, platform 102 may be used to process, transmit, or store audio data, video data, or other suitable data.

Logarithmic data compression system 110 may be implemented in hardware, software or a suitable combination of hardware and software, and may be software systems operating on a general purpose computing platform. Logarithmic data compression system 110 is operable to receive long strings of digits and to compress the long strings of digits into shorter strings of digits using logarithmic data compression techniques. Logarithmic data compression system 110 is coupled to large number storage system 112. Large number storage system 112 is configured to store numbers having a large number of digits. This is to be distinguished from numbers in exponential format, in that such numbers are typically rounded off to several digits. The large numbers stored on large number storage system 112 are stored in a format that allows each individual digit of the large number to be retained.

Communications media 104 is operable to transfer data between platform 102 and platform 106, and may be the Internet, a public switched telephone network, a dedicated line, a wireless communications network medium or other suitable communications media. Communications media 104 does not require large bandwidth, unlike other communications media that are required to transfer large amounts of data between two points. For example, communications media 104 may be implemented by users transmitting digits of compressed numbers by voice over a communications media, by ultra-low frequency data transmission systems that are used to transfer data through a conducting medium such as sea water, or by other suitable low bandwidth systems. Communications media 104 may also be a large bandwidth communications media if suitable.

Platform 106 is a suitable computer platform, such as a personal computer, a laptop, a server, a super computer or other similar computing platform. Logarithmic data decompression system 114 may be implemented in hardware, software, or a suitable combination of hardware or software and may be software systems that operate on general purpose computing platforms. Logarithmic data decompression system 114 is operable to receive the compressed data from logarithmic data compression system 110 over communications media 104, and to expand the compressed number into the original data having a large number of digits. The expanded data is then stored on large number storage system 116. In this manner, the transfer of large amounts of data may be effected, such that the data with a large number of digits is reproduced in its entirety on large number storage system 116.

In operation, a large number comprising a string of hundreds to millions of digits is stored on large number storage system 112. The large number is compressed using logarithmic data compression system 110 to form a number that has a fraction of the number of digits of the original number. For example, a number having millions of digits may be compressed to a number having less than one hundred of digits. The compressed number is then transmitted over communications media 104 to logarithmic data decompression system 114.

Logarithmic data decompression system 114 receives the compressed number from communications media 104 and expands the number using logarithmic expansion techniques. For example, logarithmic data decompression system 114 may be configured to expand the compressed number in a single operation, such that less than one hundred digits of information may be converted into a string having millions of digits of information.

Likewise, logarithmic data compression system 110 and logarithmic data decompression system 114 may be configured to compress and expand the number in a series of operations. For example, if the original number has one million digits, it may be broken down into a series of one thousand strings, each having one thousand digits. Each of these strings may be compressed to a string having a fixed or variable number of digits. For example, if the number of digits of each block is fixed at fifty digits, then the combined length of the one thousands strings would be fifty thousand digits. This first compressed number may again be broken into fifty strings having a length of one thousand digits. These fifty strings may be compressed a second time, to yield a second compressed number having twenty five hundred digits that is transmitted over the communications medium. In this exemplary embodiment, the compression ratio would be 2.5:1000.

In this example, logarithmic data decompression system 114 would receive the twenty five hundred digit number, and expand the number by performing predetermined mathematical operations on the number. For example, the compressed number may include header information that identifies the number of times the number has been compressed, the size of each block of compressed data, the type of operation that should be performed on the number, and other suitable data. Logarithmic data decompression system 114 then splits the twenty five hundred digit number into fifty blocks, each having fifty digits, and expands each fifty digit number back to a one thousand digit number. This procedure is also used to expand the fifty thousand-digit number back to the original million-digit number.

The exemplary system may be used for one way or two-way data communications. For example, logarithmic data compression and transmission system 100 may be used to distribute audio or video data, such as by using a central high power computing platform having sufficient processing speed to compress digit series having billions of digits into digit series having a small fraction of the number of digits. Smaller remote platforms may then be used to perform expansion operations, so as to create the original large number. In this manner, audio or video data files may be distributed over a communications medium without requiring a significant amount of bandwidth.

Figure 2:
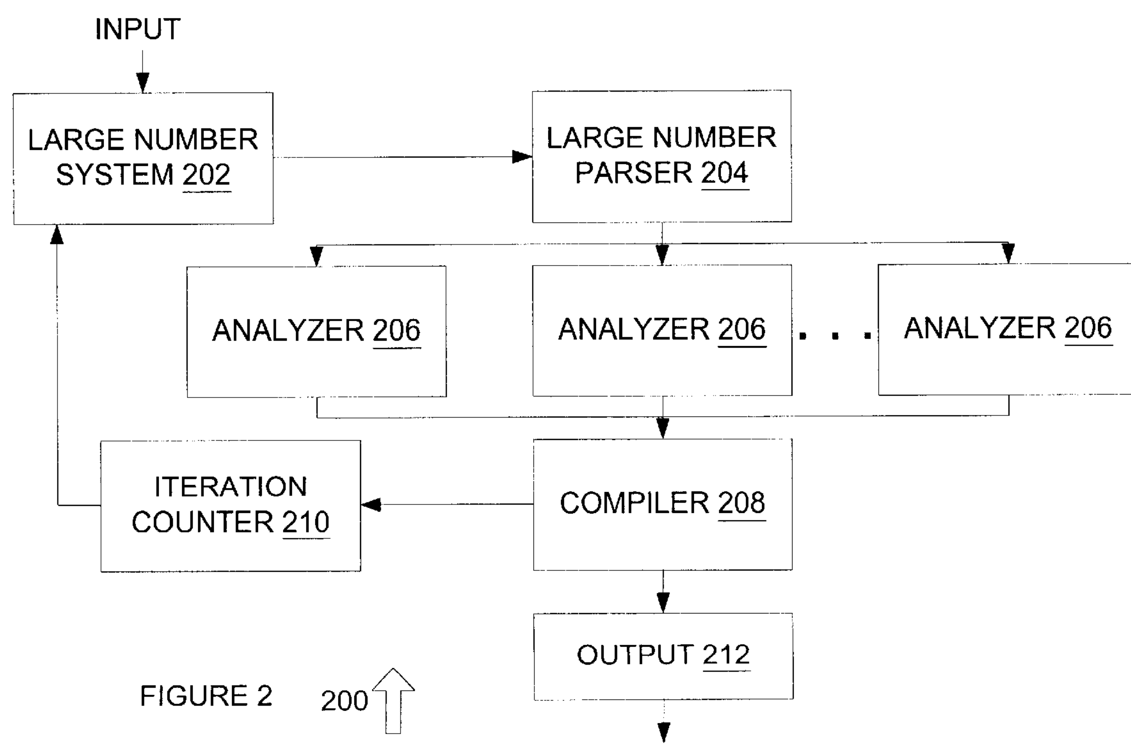
FIG. 2 is a diagram of a data compression system in accordance with an exemplary embodiment of the present invention.

FIG. 2 is a diagram of a data compression system 200 in accordance with an exemplary embodiment of the present invention. Data compression system 200 is used to logarithmically compress a number string comprising thousands or millions of digits into a number string that has a significantly less number of digits, such as less than one hundred digits.

Data compression system 200 includes large number system 202. Large number system 202 may be implemented in hardware, software, or a suitable combination of hardware and software, and may be a software system operating on a general purpose computer platform. Large number system 202 is configured to handle and maintain the integrity of number strings having a large number of digits. For example, a data file storing text data may be converted into a numerical file. Text for a book of hundreds of pages may be represented as a digit string having several million digits. Large number system 202 is operable to receive large digit strings and maintain the order of digits such that the information stored therein is not corrupted.

Large number system 202 is coupled to large number parser 204. Large number parser 204 may be implemented in hardware, software, or a suitable combination of hardware and software, and may be a software system operating on a general computing platform. Large number parser 204 is operable to receive the number string having a large number of digits from large number system 202 and to parse the number string having a large number of digits into digit strings having a predetermined number of digits. For example, large number parser 204 may receive digit strings having 1000 digits from large number system 202, and may track the sequence of these digit strings to maintain the integrity of the large number stored on large number system 202. Large number system 202 and large number parser 204 may also or alternatively both track the compression process, so as to increase compression system reliability.

Large number parser 204 is coupled to one or more analyzers 206. Each analyzer 206 is a logarithmic converter that may be implemented in hardware, software, or a suitable combination of hardware and software, and are preferably software systems operating on a general purpose computing platform. Each analyzer 206 is configured to logarithmically compress the digit strings received from large number parser 204 to smaller digit strings. For example, each analyzer 206 may use a lookup table of logarithmic conversion factors that are used to take large numbers and break them down into smaller numbers. An example of this compression technique is the number $24^7$, which equals 4,586,471,424. Logarithmic compression allows the digit string 4,586,471,424 to be presented as 24-7, where it is understood that the number after the dash is the power to which the number preceding the dash is to be raised. In this example, a ten digit string has been compressed to a three digit representation, which represents a compression ratio of greater than 3:1.

Likewise, each analyzer may utilize numerical analysis techniques to compress the large digit strings into shorter digit strings using logarithmic conversion techniques. For example, a recursive logarithmic root finding method may be used where a logarithmic root is estimated, the difference between the expanded logarithmic expression and the digit string is calculated, and the difference is then used to estimate a new root. For example, if the digit string 8,129, 900 is being analyzed, the recursive analysis method may start with 7,962,624, which is the expansion of 24 raised to the fifth power, divide the two numbers to yield 1.021007648, then take the ⅕ root of this number and multiply it by 24, which yields approximately 24.1. The method may then expand 24.1 to the fifth power, which yields 8,129,900.172, and round off the expansion to the nearest integer. It is anticipated that increases in computing power will allow increasingly effective techniques to be used to analyze large digit strings in this manner. These techniques can be easily adapted for use with analyzer 206 to decrease the amount of time required to compress large digit strings into short digit strings.

Each analyzer 206 is coupled to a compiler 208. Compiler 208 may be implemented in hardware, software, or a suitable combination of hardware and software, and may be a software system operating on a general purpose computing platform. Compiler 208 receives each of the compressed digit strings from analyzers 206 and forms a new digit string from the compressed digit strings. For example, each analyzer 206 may receive a 100 digit string and compresses the 100 digit string into a 6 digit string. Compiler 208 forms a series of 6-digit digit strings in a predetermined manner so that the sequence of 6 digit strings may be reconstructed.

Compiler 208 is coupled to iteration counter 210. Iteration counter 210 may be implemented in hardware, software, or suitable combination of hardware and software, and may be a software system operating on a general purpose computing platform. Iteration counter 210 is used to track the number of times that predetermined digit strings have been compressed. For example, large number parser 204 may be configured to parse a 20,000 digit number into twenty 1,000 digit numbers. Each 1,000 digit number may then be parsed into ten 100 digit numbers and processed by ten analyzers 206, which may each be configured to compress a 100 digit number to a 6 digit number. In this manner, a 1,000-digit number may be compressed to a 60-digit number.

Compiler 208 then stores the 60-digit number as the nineteen remaining 1,000 digit numbers in large number parser 204 are processed. Likewise, any remaining digits of the large number stored in large number system 202 will also be processed. Iteration counter 210 is operable to track the number of times that such numbers have been compressed so as to ensure that numbers are compressed and decompressed in the proper sequence.

Iteration counter 210 is coupled to large number system 202. Large number system 202 is further operable to receive the compressed numbers from compiler 208 through iteration counter 210 and to store the compressed numbers in order as they are received so as to maintain the integrity of the compression process.

Compiler 208 is also coupled to output 212. Output 212 may be implemented in hardware, software, or suitable combination of hardware and software, and may be a software system that operates on a peripheral interface device of the general purpose computing platform. For example, output 212 may be a network interface card, a terminal display device, or other suitable device that is used to transmit the compressed data to the data decompression system.

In operation, data compression system 200 is configured to handle large digit strings of indeterminate length. For example, an audio data file may comprise 5 megabytes of data, which may be represented by a digit string having in excess of 40 million digits. Data compression system 200 is configured to parse the digit strings into component strings having predetermined digit lengths, such as 1,000,000 digits, 1,000 digits, or other suitable lengths. These component strings are compressed to shorter digit strings in a predetermined manner, such as by using a logarithmic compression method. A number of iterations is performed on the variable-size large digit string, so as to create a final output digit string having a length that is less than a predetermined maximum length. This final output digit string, plus any required header data, is output for transmission to a data decompression system.

Figure 3:
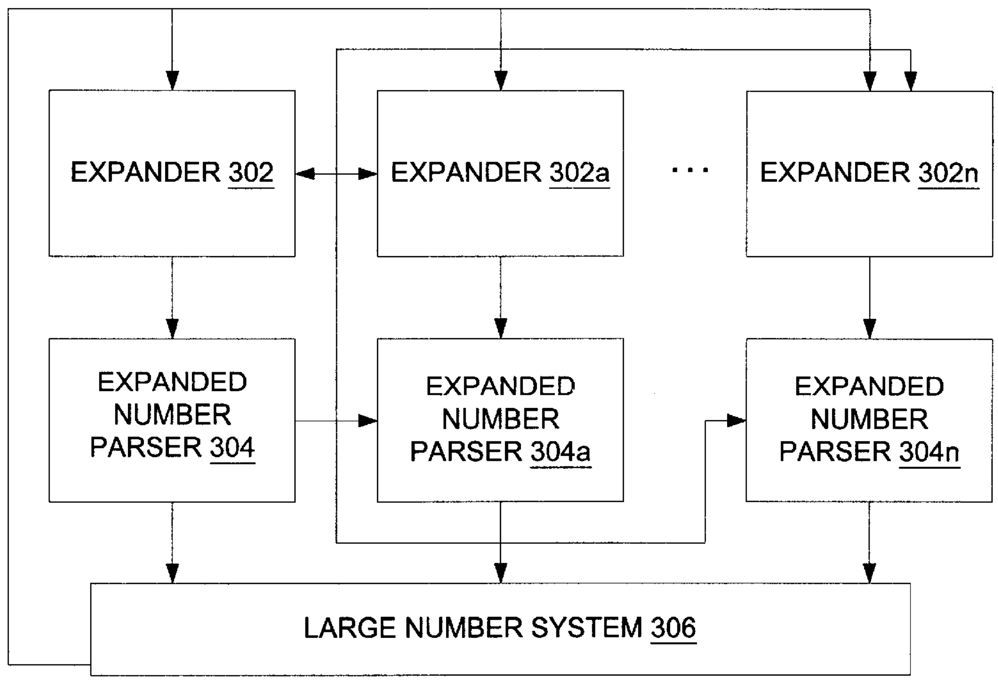
FIG. 3 is a block diagram of a data decompression system in accordance with an exemplary embodiment of the present invention.

FIG. 3 is a block diagram of a data decompression system 300 in accordance with an exemplary embodiment of the present invention. Data decompression system 300 can be used to decompress data that has been compressed by data compression system 200.

Data decompression system 300 includes expanders 302 through **302*n*. Each of expanders 302 through 302*n* may be implemented in hardware, software, or a suitable combination of hardware and software, and are preferably software systems operating on a general purpose computing platform. The number of expanders 302*n* that are used is determined by the digit length of the large number that may be handled by large number system 306, expanded number parser 304, and expander 302**.

Each expander 302 is configured to receive a digit string and to perform mathematical operations on the digit string to create a larger digit string. For example, expander 302 may receive a three-digit number that is raised to a two-digit power, which may result in a number having a large number of digits when the three digit number to the two digit power is fully expanded. To illustrate this principle, 100 raised to the 22nd power results in the number 1 followed by 44 zeroes, while 100 raised to 33rd power results in the number 1 followed by 66 zeroes. The maximum number of digits that can be processed by each expander 302 will determine the size of the exponential that can be expanded. Thus, a single expander 302 may be used, or a plurality of expanders 302 to 302*n* may be used depending on the size and digit capacity of each expander 302.

Expanded number parser 304 may be implemented in hardware, software, or a suitable combination of hardware and software, and may be a software system operating on a general purpose computing platform. Expanded number parser 304 is configured to receive the expanded number from an expander 302, and to parse the expanded number into strings of compressed numbers that are to be subsequently expanded by one or more of expanders 302 through 302*n*. For example, a first expander 302 may receive a 9-digit string and output a 27-digit string. Expanded number parser 304 may parse the 27-digit string into three 9-digit strings. Each 9-digit string may then be fed into expander 302 through 302*n*, and may result in three additional 27-digit strings. This process may be repeated until the entire large number has been reproduced. Data decompression system 300 thus results in a lossless decompression that reproduces each digit from the original compressed number, unlike known lossy compression systems that result in a number that only approximates the compressed number.

Data decompression system 300 includes large number system 306. Large number system 306 is coupled to each expanded number parser 304 through 304*n*. Large number system 306 is operable to receive decompressed numbers that have reached the original configuration of expanded digits. For example, if the digit handling capacity of expander 302 and expanded number parser 304 is limited to a predetermined number of digits, the expansion of the compressed number may require a number of iterations. After the required number of iterations has been performed, the expanded number is stored in large number system 306 in a predetermined order, along with intermediate expansion products that will require further expansion operations. In this manner, expanded number parser 304 interfaces with large number system 306 and expander 302 to control the expansion such that the original order of the compressed large number is maintained.

In operation, data decompression system 300 is used to receive a compressed digit string and to decompress the digit string by performing one or more mathematical operations on the digit string, such as a logarithmic expansion. Depending on the length of the original digit string and the data processing capabilities of the hardware, software, or combination of hardware and software that form the operating platform and system, data decompression system 300 can decompress the compressed digit string in a single operation, or may require numerous iterations. Data decompression system 300 is configured to process a variable compressed data string, so as to accommodate any suitable number of digits.

Figure 4:
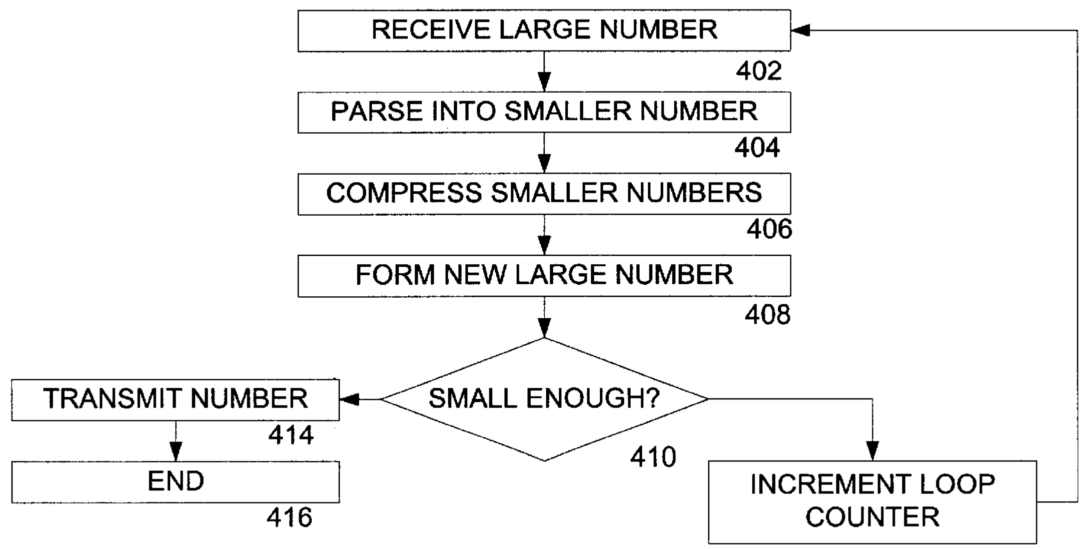
FIG. 4 is a flow chart of a method for compressing a large number in accordance with an exemplary embodiment of the present invention.

FIG. 4 is a flow chart of a method 400 for compressing a large number in accordance with an exemplary embodiment of the present invention. Method 400 begins at step 402, where a large number is received. As previously described, this large number contains a plurality of digits. The method then proceeds to step 404 where the digits of the large number are parsed into smaller digit strings. This step may be required to accommodate a large number string that is received at step 402 that has a variable length. The number of digit strings that the large number is parsed into at step 404 may be a function of this digit length.

For example, the large number compression system may be capable of handling digits having a length of 1,000,000 digits, but for digits having a length less than one million digits, the large number compression system may parse the number into strings having successively smaller lengths, such as 100,000 digits, 10,000 digits, and so forth. Other fractional digit string lengths may also be used, as suitable.

After the digit string has been parsed at step 404, the method proceeds to step 406 where each of the parsed digit strings are compressed. Likewise, if the number has not been parsed, the entire digit string is compressed. The method then proceeds to step 408 where a new large number is formed, if suitable. For example, if the original large number has been parsed into 30 strings of 100 digits, and each of the 100 digit strings is compressed to form a ten digit string, a new large number having 3000 digits may be formed at step 408. The method then proceeds to step 410.

At step 410 it is determined whether the compression of the original large number has proceeded to a point where no further compression is needed. If additional compression is needed, the method proceeds to step 412 where the loop counter is incremented. For example, if repetitive compression techniques are used, it is important to track the number of iterations that have been performed, so that the decompression process does not proceed beyond the number of iterations performed during the compression process. The number of iterations is updated at step 412, and the method then returns to step 402. If the compressed number has been compressed to a predetermined size, then the method proceeds to step 414 where a header containing predetermined data is attached to the number, and the number is transmitted over a suitable medium. This header may include data that defines the number of iterations that have been performed on the compressed number, the size of each compressed data string, and other data that is required in order to decompress the compressed digit string. The method then proceeds to step 416 and terminates.

In operation, method 400 is used to compress a long digit string in a manner that logarithmically decreases the length of the digit string. Method 400 may be performed in a single iteration where the hardware and software operating platform of the system are capable of determining a logarithmic expression for a variable digit string. Method 400 may also be performed in a series of iterations, where the length of the digit string to be compressed must be equal to a predetermined length.

Header data that describes the number of iterations, the length of compressed data strings, and other required data for decompression of the compressed data string is appended in a predetermined manner to the compressed data, and is transmitted over a communications medium with the compressed data. The compressed data string may be transmitted to a predetermined data decompression system, or may be broadcast to a large number of data decompression systems, such as for broadcast of audio or video data.

Figure 5:
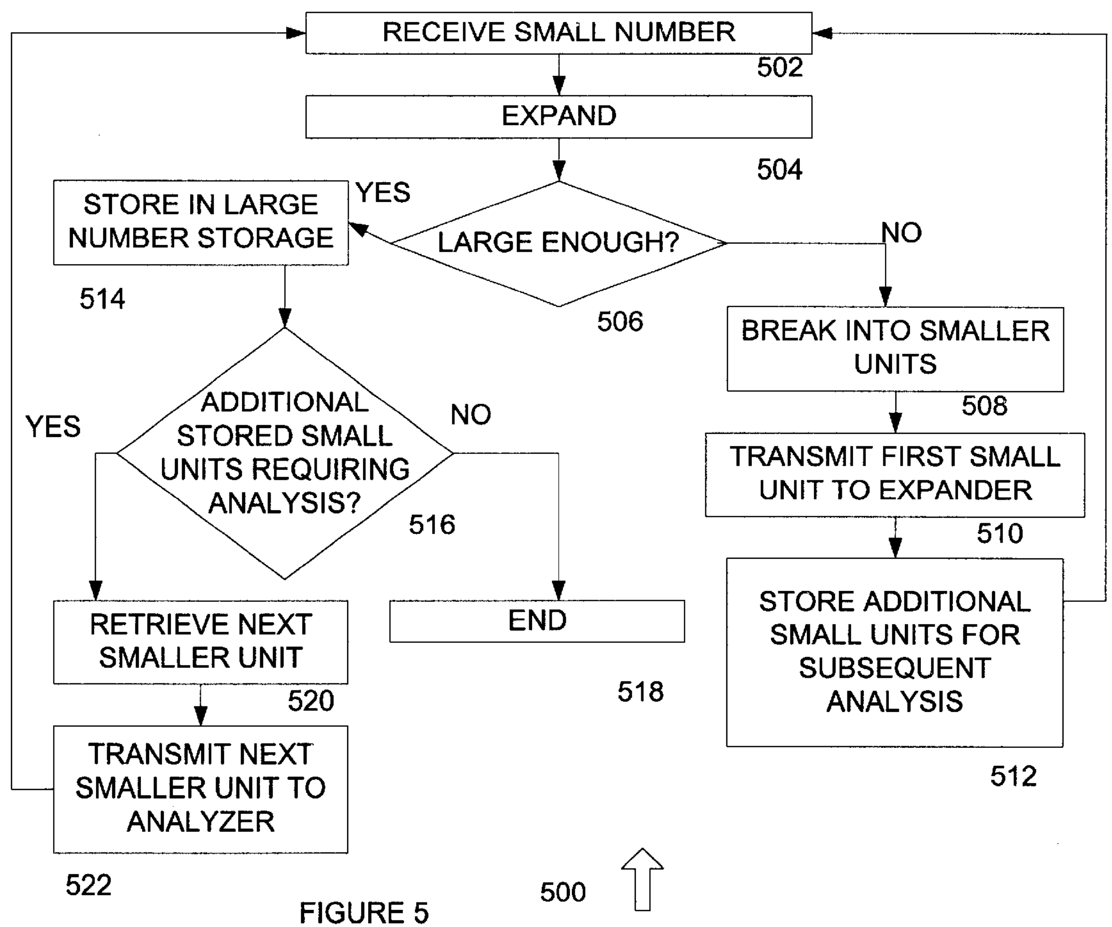
FIG. 5 is a flow chart of a method for expanding a compressed number in accordance with an exemplary embodiment of the present invention.

FIG. 5 is a flow chart of a method 500 for expanding a compressed number in accordance with an exemplary embodiment of the present invention. Method 500 begins at step 502 where the compressed number is received. The compressed number may include header data that describes the number of iterations required to decompress the data, the size of intermediate decompression strings, and other required decompression data. The method then proceeds to step 504 where the compressed number is expanded through an initial expansion phase. As previously indicated, this expansion phase will be dependent upon the size of the original number, and the digit string length processing capability of the hardware and software operating platforms on which the system operates. The method then proceeds to step 506.

At step 506 it is determined whether the digit string has reached a predetermined size. For example, header data may include a number of decompression iterations or other data that defines a predetermined number of digits for each expansion iteration of the compressed digit string. Alternatively, the hardware and software operating platform of the decompression system may have a capability that is limited to digit strings having a predetermined length. If it is determined at step 506 that the expansion is not completed, the method proceeds to step 508 where the expanded digit string is broken into small units for subsequent expansion. The method then proceeds to step 510 where the first small unit is transmitted to the expander.

At step 512, additional small units are stored for subsequent analysis. The method then returns to step 502. If it is determined at step 506 that the number has been expanded a sufficient number of times or to a predetermined size, the method proceeds to step 514. At step 514, the fully expanded number is stored in a large number storage. The method then proceeds to step 516 where it is determined whether there are additional small units requiring analysis. If all small units have been analyzed, the method proceeds to step 518 and terminates. Otherwise, the step proceeds to step 520.

At step 520, the next small unit required for analysis is retrieved. The method proceeds to step 522 and the small unit is transmitted to the small number analyzer for subsequent expansion. The method then returns to step 502.

In operation, method 500 is used to expand a compressed small number using a suitable expansion technique, such as a logarithmic expansion technique. If the processing platform operating the software system is capable of handling a long digit string having the number of digits of the fully expanded number, this expansion may be performed by solving a single logarithmic expansion. Otherwise, it may be necessary to perform a series of logarithmic expansions that necessitate storage of intermediate expansion components. The intermediate expansion iterations for each small unit or digit string must be tracked, such that the expansion stops at the original long digit string, and so that the order of the expanded components of the digit string is maintained. Method 500 may be used to process a digit string having a variable length and may be used with hardware and software platforms having varying levels of processing power, such as 16-bit processors, 32-bit processors, 64-bit processors, 128-bit processors, parallel processors, and other suitable processing platforms.

Figure 6:
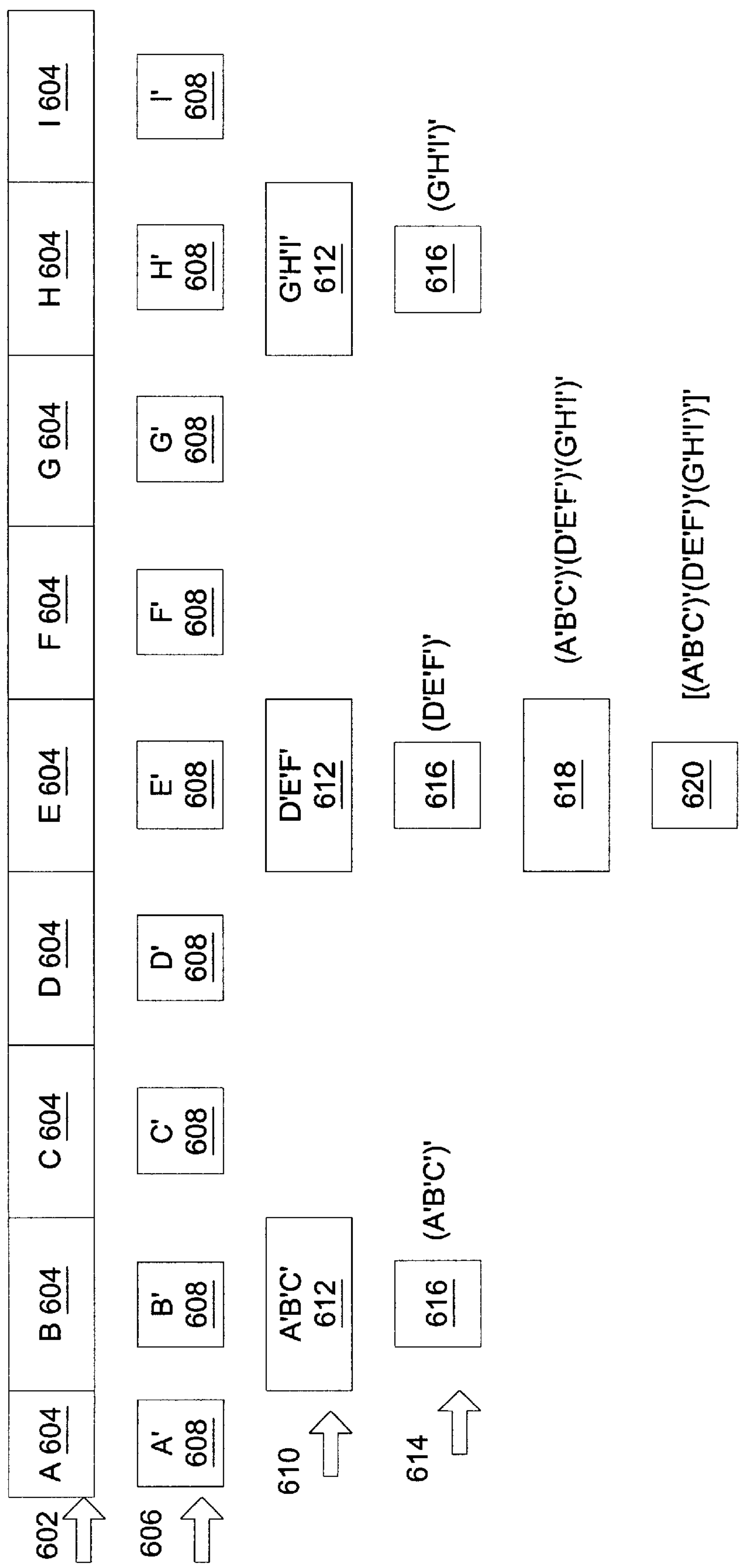
FIG. 6 is a diagram showing an exemplary data compression series in accordance with teachings of the present invention.

FIG. 6 is a diagram showing an exemplary data compression series in accordance with teachings of the present invention. FIG. 6 shows an exemplary digit series sequence 602 that includes a plurality of digit series 604, shown as units A through I. The number of digits in each digit series 604 as shown is uniform, but may also be variable depending upon the data compression technique used. The data compression technique is determined in part by the processing capability of the processing platform on which the compression system is operating. Factors that will determine the optimal number of digits of each digit series 604 include the number of bits of the data bus used by the processor, the processor operating frequency, the amount of random access memory that is allocated for use by the processor, the software operating system that controls the operations of the processor, the time required to access magnetic or optical data storage media, and other processor variables. These variables will also determine the practical size limits of files that may be compressed and decompressed.

For example, a massively-paralleled computing platform may be capable of compressing a 5 megabyte file to less than 10 kilobytes in less than one second, while a 16-bit processor with a 30 megahertz operating speed may require more than 1,000,000 seconds to perform the same compression, which is a commercially impractical length of time. The 16-bit processor may be configured to decompress the number that has been compressed by the massively-paralleled computing platform in a commercially practical length of time, though. The use of a high-powered computing platform to compress the data files and lower power computing platforms to decompress the files may be suitable for certain applications, such as to distribute compressed audio or video recordings.

Each of the individual digit series 604 is compressed to form digit series sequence 606, having individual digit series 608 that are shown as A' through I'. In the exemplary embodiment shown in FIG. 6, the data compression is performed at a 3 to 1 compression ratio, which results in the digit series sequence 606 having one-third of the original digit string length as digit series sequence 602. The digit series 608 are then combined to form the new digit series sequence 610 comprising digit series 612, which are identified as A'B'C', D'E'F', and G'H'I'.

A second compression procedure is then performed on each digit series 612, to form digit series sequence 614 comprising three digit series 616, which are identified as (A'B'C')', (D'E'F')', and (G'H'I')'. These three digit series 616 are then combined to form digit series 618, which is identified as (A'B'C')'(D'E'F')'(G'H'I')'. Digit series 618 is then compressed to form digit series 620, which is identified as [(A'B'C')'(D'E'F')'(G'H'I')']'. Thus, a series of compression operations and combination operations are performed on the original data string to compress the original string to a string having a number of digits that is 1/27th of the original number of digits. Thus, a data file consisting of 5,000,000 digits of data would be compressed to a data file having approximately 186,000 digits of data using the compression technique shown, without any loss of data.

Although a 3:1 compression ratio is shown in FIG. 6, any suitable compression ratio may be used. For example, using logarithmic compression, it is possible to compress a string of thousands of digits into a logarithmic expression contain tens of digits. Compression ratios of 100:1 or greater are therefore feasible, depending upon the processing power and logarithmic compression method utilized. The present invention contemplates the use of any suitable logarithmic compression algorithm that can perform data compression in a commercially suitable time.

One exemplary method that may be used to compress digit strings is a table lookup method, in which a table of digit strings having a predetermined length is utilized to allow the logarithmic compression for a string of digits to be determined without performing iterative logarithmic root calculations. In this example, the logarithmic roots for all numbers having a predetermined number of digits may be calculated in advance and stored in a table. For a logarithmic root table for nine digit numbers, a data file that includes 999,999 digits of data may be compressed in 111,111 steps to a data file having less than 999,999 digits of data. If each table lookup step requires one microsecond, and results in an average compression ratio of 3:1, the data file may be compressed to one third of its original size in less than one second. Other digit string lengths may be used.

Alternatively, a process combining table lookups with iterative techniques may be used. In this exemplary process, the closest pre-calculated root for a digit series may be determined first, and an expression for the difference between the precalculated root and the digit series may then be determined on an iterative basis. A third alternative process is an algorithmic process that utilizes numerical analysis methods to determine the optimal root for a number having a predetermined number of digits. Processes that utilize a variable compression ratio may require a log file of the compression ratio used for each digit series, for use during decompression.

Figure 7:
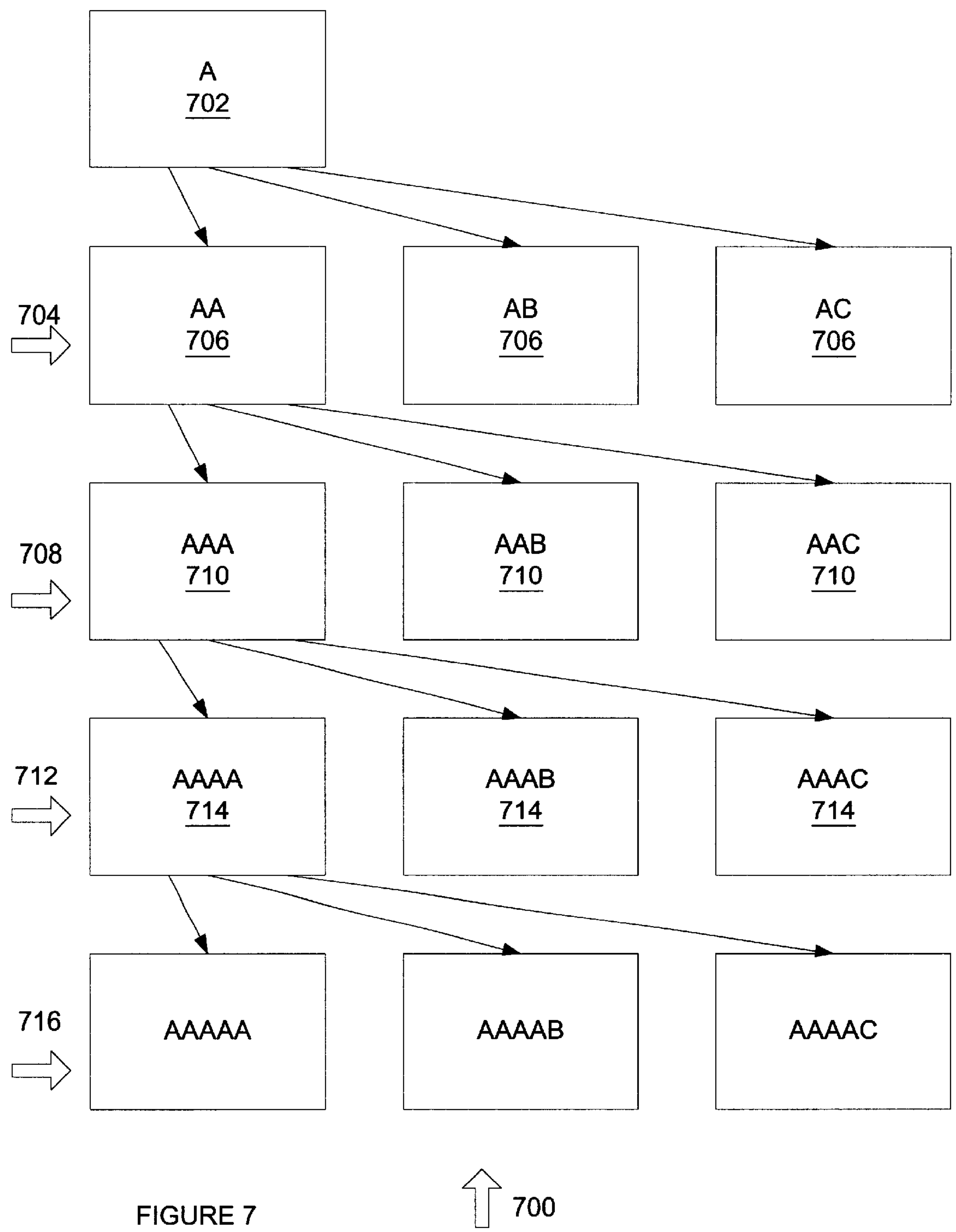
FIG. 7 is a diagram showing an exemplary data decompression series in accordance with teachings of the present invention.

FIG. 7 is a diagram showing a data decompression series 700 in accordance with teachings of the present invention. Data decompression series 700 begins with a single digit series 702, which is identified as "A" in FIG. 7. Digit series 702 is then decompressed into a digit series 704 having a length of three times the original digit series length. Digit series 704 is broken up into three digit series 706, denoted "AA," "AB," and "AC," each having the length of the original digit series 702. The digit series 706 denoted "AA" is then expanded to form a digit series 708. The digit series 706 denoted "AB" and "AC" may either be expanded in parallel or in series after completion of the expansion of the "AA" digit series.

Digit series 708 is split into three digit series 710, which are denoted "AAA," "AAB," and "AAC" as shown. Likewise, each of these digit series 710 may be subsequently expanded into digit series 712, and subsequently broken into digit series 714 such as "AAAA," "AAAB," and "AAAC." The digit series 714 expansion may likewise continue for additional stages, such as to digit series 716 to yield digit series "AAAAA," "AAAAB," and "AAAAC." If the digit series 716 is the final digit series, and all of the digit series expansions are equal in number of digits, then the original digit series is expanded into a digit series 716 having a number of digits 81 times the number of digits of the original digit series 702.

In this manner, a single digit series may be expanded using simple mathematical operations into a large digit series. Each mathematical expansion may result in a predetermined digit series length, or may alternatively result in digit series having variable lengths. For variable length series, it is necessary to either transmit header data to be used for decompression that maps the size of each expansion step, or to otherwise identify the size of intermediate expansion digit series. Likewise, a single expansion step may be used, such as by raising a number to a large power.

Although a 3:1 compression ratio is shown in FIG. 7, any suitable compression ratio may be used. For example, using logarithmic compression, it is possible to compress a string of thousands of digits into a logarithmic expression contain tens of digits. Compression ratios of 100:1 or greater are therefore feasible, depending upon the processing power and logarithmic compression method utilized. The present invention contemplates the use of any suitable logarithmic compression algorithm that can perform data compression in a commercially suitable time.

The present invention provides many important technical advantages. One important technical advantage of the present invention is a lossless data compression system and method that allows data to be logarithmically compressed so as to occupy a small fraction of the data memory that the data originally required. The present invention is thus useful to increase the amount of data that may be stored in a data memory device. Likewise, the present invention may be used to transmit large quantities of data over a communications media with limited bandwidth without loss of data.

Although preferred and exemplary embodiments of systems and methods for compressing data have been described in detail herein, those skilled in the art will also recognize that various substitutions and modifications can be made to the systems and methods without departing from the scope and spirit of the appended claims. For example, even though a logarithmic lookup table has been used in some of the exemplary embodiments described herein, other suitable types of logarithmic root finding methods may also or alternatively be used, including but not limited to iterative or curve-fitting numerical analysis methods.

What is claimed is:

1. A system for compressing data comprising:

a number parser operable to parse a field of a plurality of digits into a plurality of strings, each string having a predetermined number of digits;

a logarithmic converter coupled to the number parser, the logarithmic converter operable to convert each string into a compressed string having less than the predetermined number of digits;

a compiler coupled to the number parser and the logarithmic converter, the compiler operable to receive the plurality of compressed strings from the logarithmic converter, to form a new field having a plurality of digits, and to input the new field into the number parser; and wherein the size of the field of the plurality of digits is selected based on processing time.

2. The system of claim 1 further comprising an iteration counter coupled to the logarithmic converter, the iteration counter operable to track the number of times a field has been processed by the logarithmic converter.

3. The system of claim 1 wherein the logarithmic converter comprises a table-based system that utilizes a table of logarithmic values, in which a string is analyzed by determining the optimal combination of logarithmic components from the table of logarithmic values.

4. The system of claim 1 wherein the logarithmic converter comprises a recursion-based system that performs a series of calculations based upon the number of digits in each string, in which a string is analyzed by determining the optimal combination of logarithmic components from a recursion analysis.

5. The system of claim 1 further comprising:

an expander coupled to the compiler system, the expander operable to receive the new field and to perform a logarithmic-based expansion on the digits of the new field;

an expanded number parser coupled to the expander, the expanded number parser operable to parse the expanded new field into a plurality of fields; and a large number system coupled to the expanded number parser, the large number system operable to receive the plurality of fields from the expanded number parser.

6. The system of claim 5 wherein the large number system is coupled to the expander, the large number system operable to transfer each of the plurality of fields to the expander as a new field for logarithmic expansion.

7. The system of claim 6 further comprising an iteration counter coupled to the compiler, the iteration counter operable to track the number of times the field has been processed by the logarithmic converter.

8. A method for encoding data comprising:

extracting a data field having a predetermined number of digits from a data file, where the number of digits is selected based on processing time;

performing a logarithmic compression on the predetermined number of digits of the data field to form a compressed data field;

storing the compressed data field in a data storage device;

repeating the steps of extracting a data field, performing a logarithmic compression, and storing the compressed data field until all digits in the data file have been extracted; and wherein the compressed data fields are stored in a manner that allows each compressed data field to be identified.

9. The method of claim 8 wherein performing a logarithmic compression on the predetermined number of digits comprises locating a predetermined logarithmic expression for the data field from a database of predetermined logarithmic expressions.

10. The method of claim 8 wherein performing a logarithmic compression on the predetermined number of digits comprises performing an iterative process on the data field to determine a logarithmic expression that yields the data string.

11. The method of claim 8 further comprising repeating the steps of extracting the data field, performing the logarithmic compression, and storing the compressed data field on all digits of the data file each time that the data file is fully compressed until the number of digits of the data file is less than a predetermined number of digits.

12. The method of claim 8 wherein storing the compressed data field in a data storage device comprises:

storing the compressed data field in a first area of the data storage device; and storing tracking data for the compressed data field in a second area of the data storage device.

13. The method of claim 12 wherein the tracking data includes the number of digits of the compressed data field.

14. The method of claim 12 further comprising:

extracting a second data field having a predetermined number of digits from the second area of the data storage device;

performing a logarithmic compression on the predetermined number of digits of the second data field to form a compressed second data field;

storing the compressed second data field in a third area of the data storage device;

repeating the steps of extracting the second data field, performing the logarithmic compression, and storing the compressed second data field until all digits in the second area of the data storage device have been extracted; and wherein the compressed second data fields are stored in a manner that allows each compressed second data field to be identified.

15. A method for transmitting data comprising:

converting alphanumeric data into a numerical equivalent;

determining a logarithmic expression for the numerical equivalent;

transmitting the logarithmic expression over a communications medium;

converting the logarithmic expression back into the numerical equivalent;

converting the numerical equivalent into the alphanumeric data; and wherein a number of digits of the alphanumeric data is selected based on processing time.

16. The method of claim 15 wherein determining the logarithmic expression for the numerical equivalent comprises looking up the logarithmic expression in a table.

17. The method of claim 15 wherein determining the logarithmic expression for the numerical equivalent comprises:

parsing the numerical equivalent into one or more fields, each field having a predetermined number of digits; and determining the logarithmic expression for each field.

18. The method of claim 15 wherein transmitting the logarithmic expression over a communications medium comprises broadcasting the logarithmic expression to a plurality of receivers.

19. The method of claim 17 wherein converting the logarithmic expression back into the numerical equivalent comprises converting the logarithmic expression for each field back into the numerical equivalent for each field.

20. The method of claim 15 wherein converting the logarithmic expression back into the numerical equivalent comprises raising a first number contained in the numerical expression to the power of a second number contained in the numerical expression.

* * * * *